United States Patent
Song

(10) Patent No.: US 9,406,846 B2
(45) Date of Patent: Aug. 2, 2016

(54) LIGHT EMITTING DEVICE AND METHOD OF MANUFACTURING THE SAME FOR IMPROVING THE LIGHT EXTRACTION EFFICIENCY

(75) Inventor: June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 219 days.

(21) Appl. No.: 12/936,292

(22) PCT Filed: Apr. 6, 2009

(86) PCT No.: PCT/KR2009/001763
§ 371 (c)(1),
(2), (4) Date: Feb. 23, 2011

(87) PCT Pub. No.: WO2009/145501
PCT Pub. Date: Dec. 3, 2009

(65) Prior Publication Data
US 2011/0140152 A1 Jun. 16, 2011

(30) Foreign Application Priority Data

Apr. 5, 2008 (KR) .................. 10-2008-0031906

(51) Int. Cl.
*H01L 33/00* (2010.01)
*H01L 33/44* (2010.01)
(Continued)

(52) U.S. Cl.
CPC .............. *H01L 33/44* (2013.01); *H01L 33/387* (2013.01); *H01L 33/40* (2013.01); *H01L 33/46* (2013.01); *H01L 2933/0091* (2013.01)

(58) Field of Classification Search
CPC .............. H01L 2924/00; H01L 2924/00014; H01L 33/32; H01L 33/22; H01L 33/42; H01L 33/38; H01L 33/405; H01L 33/44; H01L 2933/0083; H01L 33/387

USPC .................... 257/94, 95, 96, 97, 98
See application file for complete search history.

(56) References Cited

U.S. PATENT DOCUMENTS 7,119,372 B2  10/2006  Stokes et al. ............ 257/79
2002/0117672 A1  8/2002  Chu et al.
(Continued)

FOREIGN PATENT DOCUMENTS

JP  11-251685  9/1999
JP  2005-191514 A  7/2005
(Continued)

OTHER PUBLICATIONS

International Search Report issued in PCT/KR2009/001763 dated Dec. 14, 2009.
(Continued)

*Primary Examiner* — Jerome Jackson, Jr.
*Assistant Examiner* — David Chen
(74) *Attorney, Agent, or Firm* — KED & Associates LLP

(57) ABSTRACT

A light emitting device according to the embodiment includes a first conductive semiconductor layer; an active layer on the first conductive semiconductor layer; a second conductive semiconductor layer on the active layer; a first passivation layer surrounding the first conductive semiconductor layer, the active layer, and the second conductive semiconductor layer; a second connection layer electrically connected to the second conductive semiconductor layer through the first passivation layer; a first light extracting structure layer on the first passivation layer and the second connection layer; a first electrode layer electrically connected to the first conductive semiconductor layer; and a second electrode layer on the first light extracting structure layer.

21 Claims, 4 Drawing Sheets

(51) Int. Cl.
  *H01L 33/38* (2010.01)
  *H01L 33/40* (2010.01)
  *H01L 33/46* (2010.01)

(56) References Cited

U.S. PATENT DOCUMENTS

| | | | |
|---|---|---|---|
| 2004/0094772 A1 | 5/2004 | Hon et al. | |
| 2004/0169181 A1 | 9/2004 | Yoo | |
| 2005/0087884 A1* | 4/2005 | Stokes et al. | 257/778 |
| 2005/0093008 A1* | 5/2005 | Suehiro et al. | 257/98 |
| 2005/0104080 A1* | 5/2005 | Ichihara et al. | 257/98 |
| 2005/0173717 A1* | 8/2005 | Lee et al. | 257/98 |
| 2005/0230699 A1* | 10/2005 | Wu et al. | 257/98 |
| 2005/0285136 A1* | 12/2005 | Ou et al. | 257/103 |
| 2006/0027815 A1 | 2/2006 | Wierer, Jr. et al. | |
| 2006/0145170 A1 | 7/2006 | Cho | 257/95 |
| 2006/0151794 A1* | 7/2006 | Wierer et al. | 257/79 |
| 2007/0090378 A1* | 4/2007 | Lee | H01L 33/44 257/94 |
| 2007/0257269 A1 | 11/2007 | Cho et al. | |
| 2007/0272933 A1 | 11/2007 | Kim et al. | 257/94 |
| 2007/0297179 A1* | 12/2007 | Leung et al. | 362/296 |
| 2008/0128721 A1* | 6/2008 | Watanabe et al. | 257/96 |
| 2008/0135868 A1 | 6/2008 | Okagawa et al. | 257/99 |
| 2009/0026475 A1 | 1/2009 | Yamaguchi et al. | |
| 2012/0228665 A1 | 9/2012 | Fukunaga et al. | 257/99 |

FOREIGN PATENT DOCUMENTS

| | | |
|---|---|---|
| JP | 2006-191103 A | 7/2006 |
| JP | 2007-184313 | 7/2007 |
| JP | 2007-294578 A | 11/2007 |
| KR | 10-2005-0013042 | 2/2005 |
| KR | 10-2007-0113406 A | 11/2007 |
| TW | 2004-08140 (A) | 9/2004 |
| WO | WO 2006/038665 A1 | 4/2006 |
| WO | WO 2006068377 A1 * | 6/2006 |

OTHER PUBLICATIONS

Korean Office Action dated Sep. 23, 2014 issued in Application No. 10-2008-0031906.
European Search Report for Application 09754966.1 dated Feb. 3, 2015.
Chinese Office Action for Application 201410136675.9 dated Apr. 12, 2016 (full Chinese text and English translation).

* cited by examiner

LIGHT EMITTING DEVICE AND METHOD OF MANUFACTURING THE SAME FOR IMPROVING THE LIGHT EXTRACTION EFFICIENCY

TECHNICAL FIELD

The embodiment relates to a light emitting device, and a method of manufacturing the same.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED is prepared as a light emitting semiconductor layer including a first conductive semiconductor layer, an active layer and a second conductive semiconductor layer, in which the active layer generates light according to current applied thereto through the first and second conductive semiconductor layers.

Meanwhile, since a material constituting the light emitting semiconductor layer has a refractive index lower than that of external air, light generated from the active layer is not effectively emitted to the outside, but totally reflected from a boundary surface and extinguished at an inside of the light emitting semiconductor layer.

To solve this problem, a concave-convex light extracting structure is formed on the first conductive semiconductor layer or the second conductive semiconductor layer provided at one side of the active layer. However, the electrical characteristics of the LED may be degraded due to the light extracting structure.

DISCLOSURE

Technical Problem

The embodiment provides a light emitting device having a novel structure and a method of manufacturing the same.

The embodiment provides a light emitting device capable of improving the electrical characteristic and light extraction efficiency and a method of manufacturing the same.

Technical Solution

A light emitting device according to the embodiment may include a first conductive semiconductor layer; an active layer on the first conductive semiconductor layer; a second conductive semiconductor layer on the active layer; a first passivation layer surrounding the first conductive semiconductor layer, the active layer, and the second conductive semiconductor layer; a second connection layer electrically connected to the second conductive semiconductor layer through the first passivation layer; a first light extracting structure layer on the first passivation layer and the second connection layer; a first electrode layer electrically connected to the first conductive semiconductor layer; and a second electrode layer on the first light extracting structure layer.

A method of manufacturing a light emitting device according to the embodiment may include the steps of forming a first conductive semiconductor layer on a growth substrate, an active layer on the first conductive semiconductor layer, and a second conductive semiconductor layer on the active layer; selectively removing the second conductive semiconductor layer, the active layer, and the first conductive semiconductor layer such that the first conductive semiconductor layer is partially exposed; forming a first passivation layer surrounding the first conductive semiconductor layer, the active layer, and the second conductive semiconductor layer; selectively removing the first passivation layer and forming a second connection layer electrically connected to the second conductive semiconductor layer; forming a first light extracting structure layer having a concave-convex structure on the second connection layer and the first passivation layer; and forming a second electrode layer on the first light extracting structure layer and forming a first electrode layer electrically connected to the first conductive semiconductor layer.

Advantageous Effects

The embodiment can provide a light emitting device having a novel structure and a method of manufacturing the same.

The embodiment can provide a light emitting device capable of improving the electrical characteristic and light extraction efficiency and a method of manufacturing the same.

BEST MODE

Mode for Invention

Figure 1:
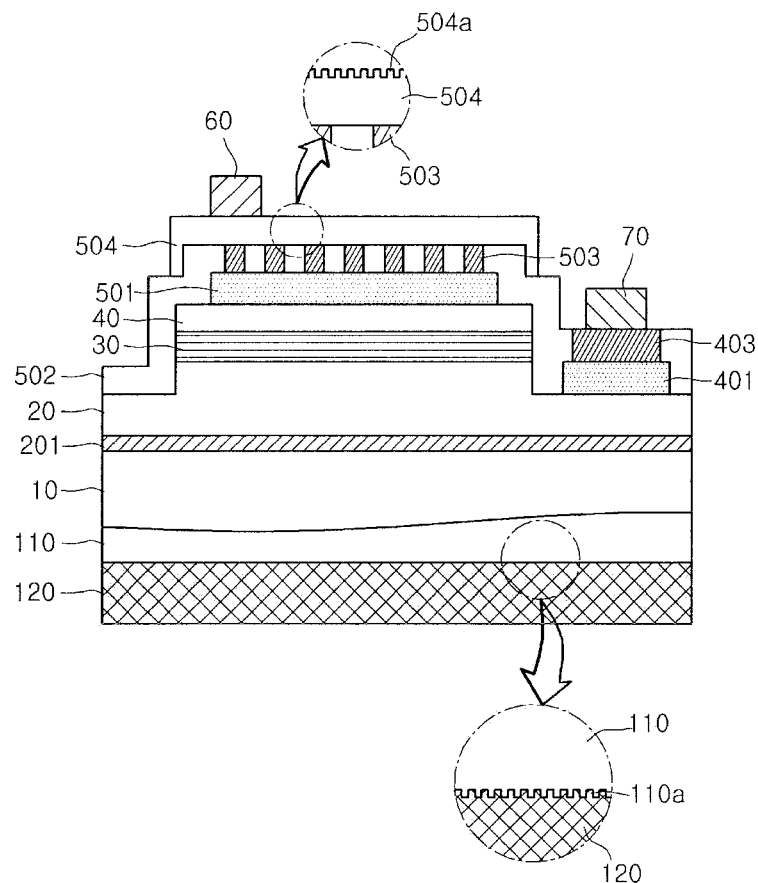
FIG. 1 is a sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a sectional view showing a light emitting device according to the first embodiment.

Referring to FIG. 1, a buffer layer 201 is formed on a growth substrate 10, and a light emitting semiconductor layer including a first conductive semiconductor layer 20, an active layer 30, and a second conductive semiconductor layer 40 is formed on the buffer layer 201.

The light emitting semiconductor layer is partially removed through MESA etching, and a first current spreading layer 401 is formed on the first conductive semiconductor layer 20 exposed through the MESA etching. In addition, a second current spreading layer 501 is formed on a second conductive semiconductor layer 40.

A first passivation layer 502 is formed to surround the light emitting semiconductor layer and the first and second current spreading layers 401 and 501. The first passivation layer 502 formed on the first and second current spreading layers 401 and 501 is selectively removed so that a via hole is formed. A first connection layer 403 and a second connection layer 503 are formed in the via hole.

A first light extracting structure layer 504 is formed on the first passivation layer 502 and the second connection layer 503 formed on the second conductive semiconductor layer 40.

In addition, a first electrode layer 70 is formed on the first connection layer 403 and a second electrode layer 60 is formed on the first light extracting structure layer 504.

Further, a second light extracting structure layer 110 is formed under the growth substrate 10 and a reflective layer 120 is formed under the second light extracting structure layer 110.

In more detail, for example, the growth substrate 10 may include one of $Al_2O_3$, SiC, Si, AlN, GaN, AlGaN, glass and GaAs.

Before the first conductive semiconductor layer 20 is grown, the buffer layer 201 is formed on the growth substrate 10. For instance, the buffer layer 201 may include at least one of InGaN, AlN, SiC, SiCN, and GaN.

The light emitting semiconductor layer including the first conductive semiconductor layer 20, the active layer 30, and the second conductive semiconductor layer 40 may include group-III nitride-based semiconductor materials. For example, the first conductive semiconductor layer 20 may include a gallium nitride layer including n type impurities such as Si, and the second conductive semiconductor layer 40 may include a gallium nitride layer including p type impurities such as Mg. In addition, the active layer 30, which generates light through the recombination of electrons and holes, may include one of InGaN, AlGaN, GaN, and AlInGaN. The wavelength of light emitted from the light emitting device is determined according to the type of materials constituting the active layer 30.

The active layer 30 and the second conductive semiconductor layer 40 are formed on a part of the first conductive semiconductor layer 20. In other words, one part of the first conductive semiconductor layer 20 makes contact with the active layer 30 and the remaining part of the first conductive semiconductor layer 20 is exposed to the outside.

Although not shown, an interface modification layer may be further formed on the second conductive semiconductor layer 40.

The interface modification layer may include a superlattice structure, one of InGaN, GaN, AlInN, AlN, InN, and AlGaN doped with first conductive impurities, one of InGaN, GaN, AlInN, AlN, InN, and AlGaN doped with second conductive impurities, or one of group III nitride-based elements having nitrogen-polar surfaces. In particular, the interface modification layer having the superlattice structure may include nitride or carbon nitride including group II, III, or IV elements.

The first current spreading layer 401 is partially formed on the first conductive semiconductor layer 20, and the second current spreading layer 501 is partially or wholly formed on the second conductive semiconductor layer 40.

Both of the first and second current spreading layers 401 and 501 may not be necessarily required. That is, at least one of the first and second current spreading layers 401 and 501 may be omitted.

The first and second current spreading layers 401 and 501 can be prepared as a single layer structure or a multi-layer structure including at least one selected from the group consisting of ITO (indium tin oxide), doped ZnO (doped Zinc oxide), TiN (titanium nitride), IZO (indium zinc oxide), IZTO (indium zinc tin oxide), NiO (nickel oxide), $RuO_2$ (ruthenium oxide), $IrO_2$ (iridium oxide), doped $In_2O_3$ (doped indium oxide), Au, Ag, doped $SnO_2$ (doped tin oxide), GITO (gallium indium tin oxide), PdO (palladium oxide), PtO (platinum oxide), $Ag_2O$ (silver oxide), and doped $TiO_2$ (doped titanium oxide).

The first and second current spreading layers 401 and 501 uniformly spread current applied to the first and second conductive semiconductor layers 20 and 40, thereby improving light emitting efficiency. In addition, the first and second current spreading layers 401 and 501 allow the first and second electrode layers 70 and 60 to be sufficiently bonded to the first and second conductive semiconductor layers 20 and 40, respectively.

The first passivation layer 502 is formed on the light emitting semiconductor layer including the first and second current spreading layers 401 and 501 except for some portions of the first and second current spreading layers 401 and 501. The first passivation layer 502 prevents the light emitting device from being physically, chemically, or electrically damaged.

The first passivation layer 502 includes a transparent electric insulating material. For example, the first passivation layer 502 includes at least one of $SiO_2$ (silicon dioxide), $SiN_x$ (silicon nitride), $MgF_2$ (magnesium fluoride), $Cr_2O_3$ (chromium oxide), $Al_2O_3$ (aluminum oxide), $TiO_2$, ZnS (zinc sulfide), ZnO (zinc oxide), $CaF_2$ (calcium fluoride), AlN (aluminum nitride), and CrN (chromium nitride).

The first and second connection layers 403 and 405 are formed on the first and second current spreading layers 401 and 501, respectively, while passing through the first passivation layer 502. In detail, the first passivation layer 502 formed on the first and second current spreading layers 401 and 501 has via holes and the via holes are filled with conductive materials to form the first and second connection layers 403 and 405.

According to the embodiment, a plurality of via holes are formed in the first passivation layer 502 formed on the second current spreading layer 501, but the embodiment is not limited thereto. For instance, only one via hole can be formed in the first passivation layer 502 formed on the second current spreading layer 501 to form the first connection layer 403.

The first connection layer 403 may not be necessarily required. That is, the first connection layer 403 can be omitted.

The first and second connection layers 403 and 503 can be prepared as a single layer structure or a multi-layer structure by using transparent electric conductive materials including at least one selected from the group consisting of ITO (indium tin oxide), doped ZnO (doped Zinc oxide), TiN (titanium nitride), IZO (indium zinc oxide), IZTO (indium zinc tin oxide), NiO (nickel oxide), $RuO_2$ (ruthenium oxide), $IrO_2$ (iridium oxide), doped $In_2O_3$ (doped indium oxide), Au, Ag, doped $SnO_2$ (doped tin oxide), GITO (gallium indium tin oxide), PdO (palladium oxide), PtO (platinum oxide), $Ag_2O$ (silver oxide), and doped $TiO_2$ (doped titanium oxide).

The first light extracting structure layer 504 is provided on the first passivation layer 502 and the second connection layer 503 formed on the second conductive semiconductor layer 40. The first light extracting structure layer 504 can be formed while making contact with a plurality of second connection layers 503.

The first light extracting structure layer 504 may include an electric conductive material having high light transmissivity and can be formed on the surface thereof with a concave-convex structure 504a having a cylindrical shape or a conical shape.

For example, the first light extracting structure layer 504 may include group II-VI compounds including ZnO or MgZnO, or group III-V compounds including GaN or AlN. The first light extracting structure layer 504 may include hexagonal crystalline material. In addition, the first light extracting structure layer 504 may include $TiO_2$ or $Al_2O_3$.

The first electrode layer 70 is formed on a part of the first connection layer 403. If the first connection layer 403 and the first current spreading layer 501 are omitted, the first electrode layer 70 may make contact with the first conductive semiconductor layer 20.

In order to form an interface having a superior adhesive property with respect to the first conductive semiconductor layer 20, the first current spreading layer 401, or the first connection layer 403, the first electrode layer 70 may include a material forming an ohmic contact interface with respect to the first conductive semiconductor layer 20, the first current spreading layer 401, or the first connection layer 403. For example, the first electrode layer 70 may include one of Ti, Al, Cr, V, Au, and Nb. In addition, the first electrode 70 can be formed by using silicide.

The second electrode layer 60 is formed on a part of the first light extracting structure layer 504.

The second electrode layer 60 may include a material forming an interface or a schottky contact interface representing a superior adhesive property with respect to the first light extracting structure layer 504. For example, the second electrode layer 60 may include at least one of Ni, Al, Cr, Cu, Pt, Au, Pd, ITO, ZnO, ZITO, TiN, and IZO. In addition, the second electrode layer 60 can be formed by using silicide.

The second light extracting structure layer 110 is formed under the growth substrate 10. Similar to the first light extracting structure layer 504, the second light extracting structure layer 110 may have a concave-convex structure 110a.

The reflective layer 120 is formed under the second light extracting structure layer 110 by using a material having a high reflective rate. For example, the reflective layer 120 may include at least one of Ag, Al, Rh, Pd, Ni, Au, a DBR (Distributed Bragg Reflector), and an ODR (Omni-Directional Reflector).

FIGS. 2 to 9 are sectional views showing the procedure for manufacturing the light emitting device according to the first embodiment.

Figure 2:
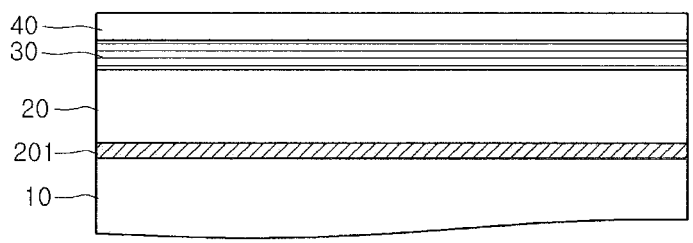
FIGS. 2 to 9 are sectional views showing the procedure for manufacturing a light emitting device according to the first embodiment.

Referring to FIG. 2, the buffer layer 201 is formed on the growth substrate 10, and the light emitting semiconductor layer including the first conductive Semiconductor layer 20, the active layer 30, and the second conductive semiconductor layer 40 is formed on the buffer layer 201. Although not shown in the drawings, an interface modification layer can be further formed on the second conductive semiconductor layer 40.

Figure 3:
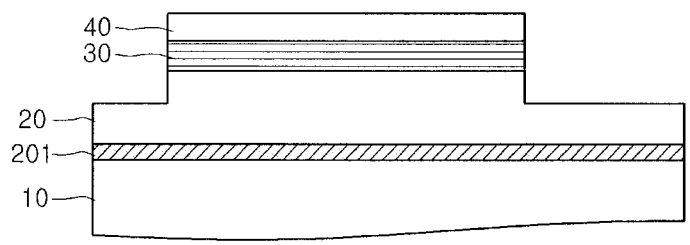

Referring to FIG. 3, the light emitting semiconductor layer is partially removed through a MESA etching process such that the first conductive semiconductor layer 20 can be partially exposed.

Figure 4:
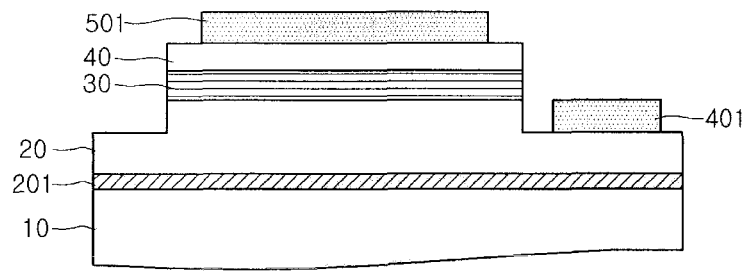

Referring to FIG. 4, the first current spreading layer 401 is formed on the first conductive semiconductor layer 20, and the second current spreading layer 501 is formed on the second conductive semiconductor layer 40. The first and second current spreading layers 401 and 501 can be formed the physical vapor deposition (PVD) or chemical vapor deposition (CVD).

Figure 5:
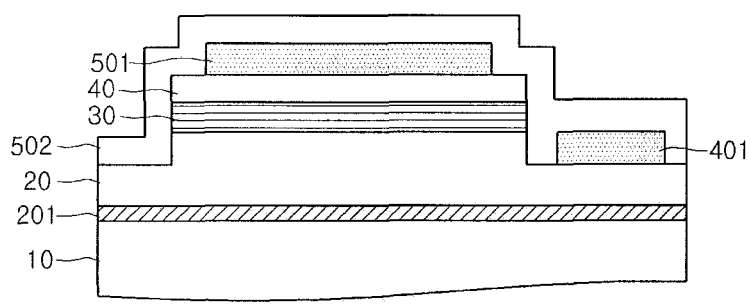

Referring to FIG. 5, the first passivation layer 502 is formed on the light emitting semiconductor layer including the first and second current spreading layers 401 and 501. The first passivation layer 502 can be formed the physical vapor deposition (PVD) or chemical vapor deposition (CVD).

Figure 6:
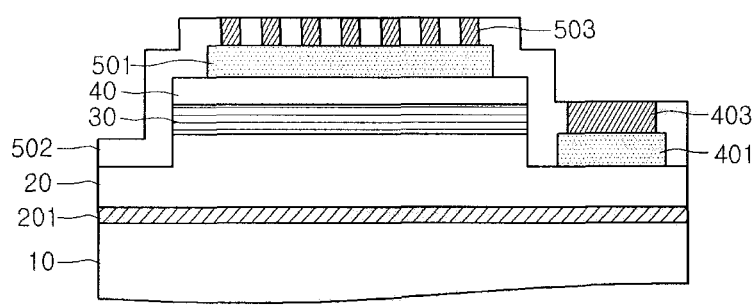

Referring to FIG. 6, the first passivation layer 502 is selectively removed, so that the via holes are formed to expose the first and second current spreading layers 401 and 501.

In addition, the first and second connection layers 403 and 405 are formed in the via holes.

Figure 7:
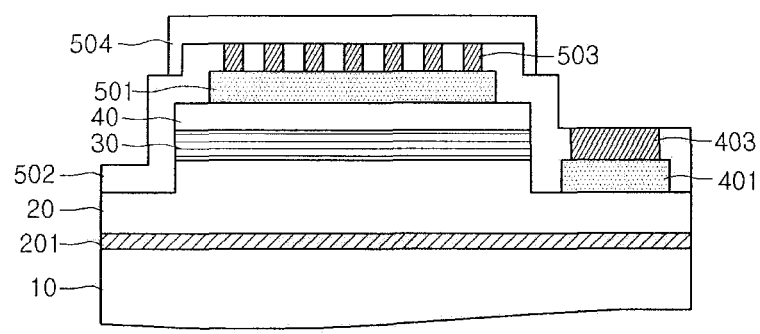

Referring to FIG. 7, the first light extracting structure layer 504 is formed on the first passivation layer 502 and the second connection layer 503.

The first light extracting structure layer 504 can be formed through the deposition or growing scheme, such as the MOCVD (metal organic chemical vapor deposition), MBE (molecular beam epitaxy), PLD (pulsed laser deposition), sputtering, ALD (atomic level deposition), or CVD (chemical vapor deposition).

Figure 8:
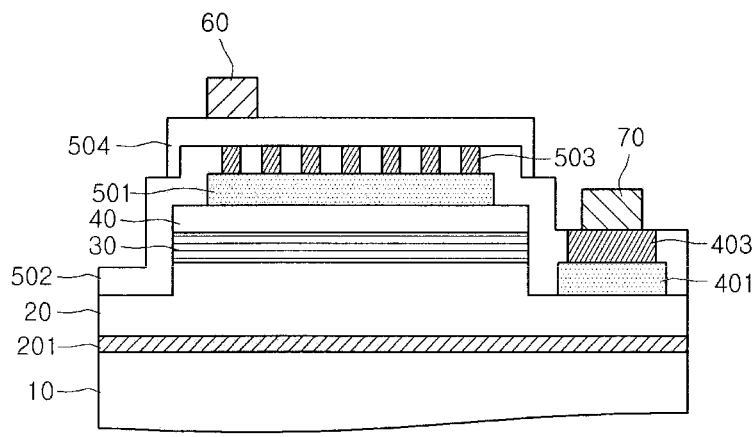

Referring to FIG. 8, after forming the first light extracting structure layer 504 and the second electrode layer 60, the first electrode layer 70 is formed on the first connection layer 403.

Figure 9:
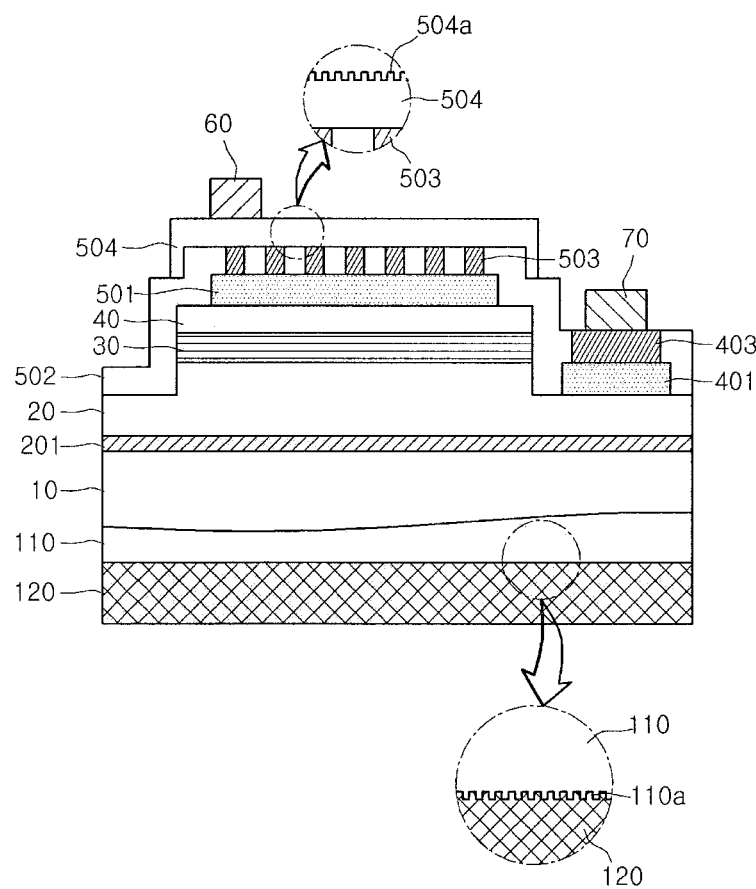

Referring to FIG. 9, the second light extracting structure layer 110 and the reflective layer 120 are finally formed under the growth substrate 10.

Similar to the first light extracting structure layer 504, the second light extracting structure layer 110 can be formed through the deposition or growing scheme. The reflective layer 120 can be formed through the PVD or CVD.

Figure 10:
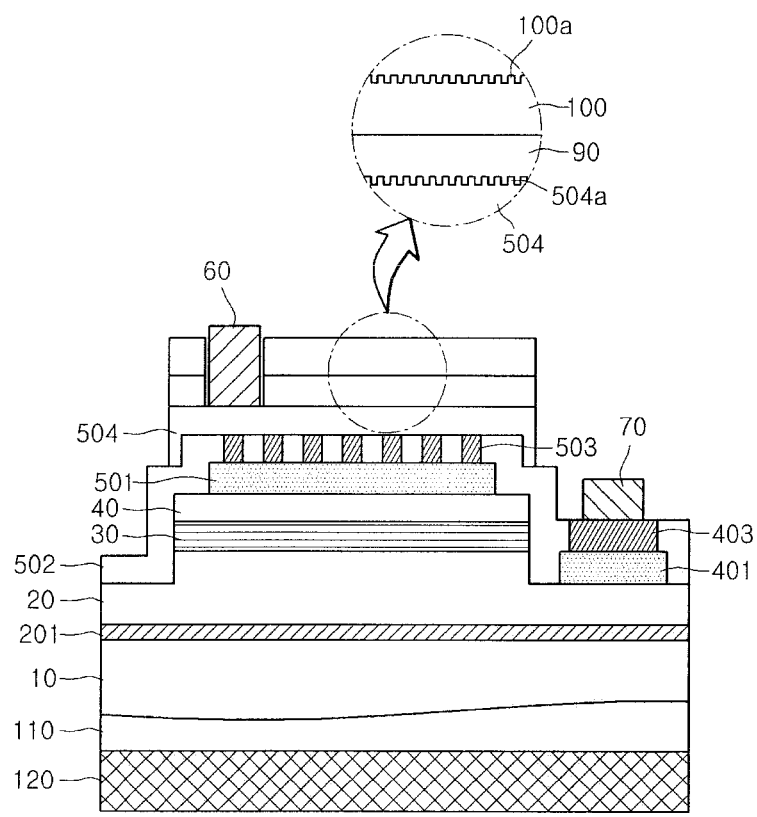
FIG. 10 is a sectional view showing a light emitting device according to the second embodiment.

FIG. 10 is a view showing a light emitting device according to the second embodiment.

The light emitting device according to the second embodiment has the structure similar to that of the light emitting device according to the first embodiment. Therefore, the following description will be focused on the difference from the light emitting device according to the first embodiment in order to avoid redundancy.

Referring to FIG. 10, the buffer layer 201 is formed on the growth substrate 10, and the light emitting semiconductor layer including the first conductive semiconductor layer 20, the active layer 30, and the second conductive semiconductor layer 40 is formed on the buffer layer 201.

The light emitting semiconductor layer is partially removed through a MESA etching process, and the first current spreading layer 401 is formed on the first conductive semiconductor layer 20 exposed through the MESA etching process. In addition, the second current spreading layer 501 is formed on the second conductive semiconductor layer 40.

The first passivation layer 502 is formed to surround the light emitting semiconductor layer and the first and second current spreading layers 401 and 501. The first passivation layer 502 formed on the first and second current spreading layers 401 and 501 is selectively removed to form the via holes and the first and second connection layers 403 and 503 are formed in the via holes.

The first light extracting structure layer 504 is formed on the first passivation layer 502 and the second connection layer 503 formed on the second conductive semiconductor layer 40.

In addition, a second passivation layer 90 is formed on the first light extracting structure layer 504, and a third light extracting structure layer 100 is formed on the second passivation layer 90.

Further, the first electrode layer 70 is formed on the first connection layer 403, and the second electrode layer 60 is formed on a region where the second passivation layer 90 and the third light extracting structure layer 100 are selectively removed, so that the second electrode layer 60 is electrically connected to the first light extracting structure layer 504.

In addition, the second light extracting structure layer 110 is formed under the growth substrate 110, and the reflective layer 120 is formed under the second light extracting structure layer 110.

The second passivation layer 90 includes a transparent electric insulating material. For example, the second passivation layer 90 includes at least one of $SiO_2$ (silicon dioxide), $SiN_x$ (silicon nitride), $MgF_2$ (magnesium fluoride), $Cr_2O_3$ (chromium oxide), $Al_2O_3$ (aluminum oxide), $TiO_2$, ZnS (zinc sulfide), ZnO (zinc oxide), $CaF_2$ (calcium fluoride), AlN (aluminum nitride), and CrN (chromium nitride).

The third light extracting structure layer 100 has a concave-convex structure 100a. The third light extracting structure layer 100 may include group II-VI compounds, such as ZnO, or group III-V compounds, such as GaN. In addition, the third light extracting structure layer 100 may include hexagonal crystalline material.

In addition, the third light extracting structure layer 100 may include one of $TiO_2$, $Al_2O_3$, $SiO_2$, $SiN_x$, $MgF_2$ (magnesium fluoride), $Cr_2O_3$ (chromium oxide), ZnS (zinc sulfide), ZnO (zinc oxide), $CaF_2$ (calcium fluoride), AlN (aluminum nitride), and CrN (chromium nitride).

Although not shown, the method of manufacturing the light emitting device according to the second embodiment is similar to that of the first embodiment.

In detail, after performing the processes shown in FIGS. 2 to 7, the second passivation layer 90 and the third light extracting structure layer 100 are formed on the first light extracting structure layer 504 shown in FIG. 7. Then, the second passivation layer 90 and the third light extracting structure layer 100 are selectively removed to expose the first light extracting structure layer 504.

In addition, after forming the first light extracting structure layer 504 and the second electrode layer 60, the first electrode layer 70 is formed on the first connection layer 403.

Finally, the second light extracting structure layer 110 and the reflective layer 120 are formed under the growth substrate 10.

Although embodiments have been described with reference to a number of illustrative embodiments thereof, it should be understood that numerous other modifications and embodiments can be devised by those skilled in the art that will fall within the spirit and scope of the principles of this disclosure.

INDUSTRIAL APPLICABILITY

The embodiment is applicable to a light emitting device used as a light source.

The invention claimed is:

1. A light emitting device comprising:
a first conductive semiconductor layer;
an active layer on the first conductive semiconductor layer;
a second conductive semiconductor layer on the active layer;
a passivation layer surrounding the first conductive semiconductor layer, the active layer, and the second conductive semiconductor layer;
a first current spreading layer on the first conductive semiconductor layer;
a first connection layer on the first current spreading layer;
a second connection layer electrically connected to the second conductive semiconductor layer through the passivation layer;
a second current spreading layer electrically connected to the second connection layer on the second conductive semiconductor layer;
a first light extracting structure layer directly disposed on the passivation layer and the second connection layer;
a first electrode layer on the first connection layer, wherein the first connection layer electrically connects the first electrode layer to the first current spreading layer; and
a second electrode layer on the second conductive semiconductor layer, and
wherein a plurality of via holes are formed in the passivation layer corresponding to the second current spreading layer, and the second connection layer is provided within the via holes such that the second connection layer electrically connects the first light extracting structure layer to the second current spreading layer, wherein the first connection layer is disposed between the first electrode layer and the first current spreading layer, and the second connection layer is disposed between the first light extracting structure layer and the second current spreading layer,
wherein a width of the first current spreading layer is larger than a width of the first connection layer, and a width of the second conductive semiconductor layer is larger than a width of the second current spreading layer,
wherein the second electrode layer is spaced apart from the passivation layer, and
wherein the second electrode layer is vertically overlapped with the passivation layer, and wherein the first light extracting structure layer is disposed between the passivation layer and the second electrode layer, and wherein the first light extracting structure layer is in contact with a top surface of the second connection layer.

2. The light emitting device of claim 1, wherein the second connection layer includes a plurality of second connection layers formed in the passivation layer having a stepped portion.

3. The light emitting device of claim 1, wherein the first light extracting structure layer is formed on a top surface of the passivation layer corresponding to the second conductive semiconductor layer.

4. The light emitting device of claim 1, wherein the first connection layer is electrically connected to the first electrode layer through the passivation layer on the first conductive semiconductor layer.

5. The light emitting device of claim 1, further comprising a growth substrate under the first conductive semiconductor layer.

6. The light emitting device of claim 5, further comprising a second light extracting structure layer having a concave-convex structure under the growth substrate.

7. The light emitting device of claim 5, further comprising a reflective layer under the growth substrate.

8. The light emitting device of claim 1, wherein the second current spreading layer is prepared as a single layer structure or a multi-layer structure by using at least one selected from the group consisting of ITO (indium tin oxide), doped ZnO (doped Zinc oxide), TiN (titanium nitride), IZO (indium zinc oxide), IZTO (indium zinc tin oxide), NiO (nickel oxide), $RuO_2$ (ruthenium oxide), $IrO_2$ (iridium oxide), doped $In_2O_3$ (doped indium oxide), Au, Ag, doped $SnO_2$ (doped tin oxide), GITO (gallium indium tin oxide), PdO (palladium oxide), PtO (platinum oxide), $Ag_2O$ (silver oxide) and doped $TiO_2$ (doped titanium oxide).

9. The light emitting device of claim 1, wherein the first current spreading layer is prepared as a single layer structure or a multi-layer structure by using at least one selected from the group consisting of ITO (indium tin oxide), doped ZnO (doped Zinc oxide), TiN (titanium nitride), IZO (indium zinc oxide), IZTO (indium zinc tin oxide), NiO (nickel oxide), RuO$_2$ (ruthenium oxide), IrO$_2$ (iridium oxide), doped In$_2$O$_3$ (doped indium oxide), Au, Ag, doped SnO$_2$ (doped tin oxide), GITO (gallium indium tin oxide), PdO (palladium oxide), PtO (platinum oxide), Ag$_2$O (silver oxide), and doped TiO$_2$ (doped titanium oxide).

10. The light emitting device of claim 1, wherein the first light extracting structure layer includes one of group II-VI compounds including ZnO or MgZnO, group III-V compounds including GaN or AlN, and compound including TiO$_2$ and Al$_2$O$_3$.

11. The light emitting device of claim 1, wherein a via hole is provided in the passivation layer corresponding to the first current spreading layer.

12. The light emitting device of claim 1, wherein the plurality of via holes are provided between a first side surface and a second side surface of the passivation layer, and a first portion of the first light extracting structure layer contacts the first side surface of the passivation layer and a second portion of the first light extracting structure layer contacts the second side surface of the passivation layer.

13. A light emitting device comprising:
a first conductive semiconductor layer;
an active layer on the first conductive semiconductor layer;
a second conductive semiconductor layer on the active layer;
a passivation layer to surround a portion of the first conductive semiconductor layer, a portion of the active layer, and a portion of the second conductive semiconductor layer;
a first current spreading layer on the first conductive semiconductor layer;
a first connection member on the first current spreading layer;
a second connection member, provided in the passivation layer, to electrically connect to the second conductive semiconductor layer;
a second current spreading layer electrically connected to the second connection member on the second conductive semiconductor layer;
a first light extracting structure layer directly disposed on the passivation layer and on the second connection member;
a first electrode on the first connection member, wherein the first connection member electrically connects the first electrode to the first current spreading layer; and
a second electrode on the second conductive semiconductor layer, and
wherein a plurality of via holes are provided in the passivation layer corresponding to the second current spreading layer, and the second connection member is provided within the via holes such that the second connection member electrically connects the first light extracting structure layer to the second current spreading layer,
wherein a width of the first light extracting structure layer is larger than a width of the plurality of via holes, wherein the first connection member is disposed between the first electrode and the first current spreading layer, and the second connection member is disposed between the first light extracting structure layer and the second current spreading layer,
wherein a width of the first current spreading layer is larger than a width of the first connection member, and a width of the second conductive semiconductor layer is larger than a width of the second current spreading layer,
wherein the first light extracting structure layer is disposed between the passivation layer and the second electrode, and wherein the first light extracting structure layer is in contact with a top surface of the second connection member.

14. The light emitting device of claim 13, wherein the first light extracting structure layer is formed on a top surface of the passivation layer corresponding to the second conductive semiconductor layer.

15. The light emitting device of claim 13, further comprising a second light extracting structure layer having a concave-convex structure under the first conductive semiconductor layer.

16. The light emitting device of claim 15, further comprising a reflective layer under the second light extracting structure layer.

17. The light emitting device of claim 13, wherein the first connection member is electrically connected to the first electrode through the passivation layer on the first conductive semiconductor layer.

18. The light emitting device of claim 13, further comprising a growth substrate under the first conductive semiconductor layer.

19. The light emitting device of claim 13, wherein the plurality of via holes are provided between a first side surface and a second side surface of the passivation layer, and a first portion of the first light extracting structure layer contacts the first side surface of the passivation layer and a second portion of the first light extracting structure layer contacts the second side surface of the passivation layer.

20. A light emitting device comprising:
a light emitting structure that includes a first conductive semiconductor layer, an active layer on the first conductive semiconductor layer, and a second conductive semiconductor layer on the active layer;
a passivation layer to surround a portion of the light emitting structure, and the passivation layer including a plurality of via holes between a first side surface of the passivation layer and a second side surface of the passivation layer;
a first current spreading layer on the first conductive semiconductor layer;
a first connection member on the first current spreading layer such that the first current spreading layer is between the first conductive semiconductor layer and the first connection member;
a plurality of second connection members provided in the via holes of the passivation layer;
a second current spreading layer on the second conductive semiconductor layer;
a first light extracting structure layer on the plurality of second connection members, and the second connection members to electrically connect the second current spreading layer to the first light extracting structure layer;
a first electrode on the first connection member, and the first connection member to electrically connect the first electrode to the first current spreading layer; and
a second electrode on the first light extracting structure layer,
wherein a width of the first light extracting structure layer is larger than a width of the plurality of via holes between the first side surface and the second side surface of the passivation layer,
wherein the first connection member is disposed between the first electrode and the first current spreading layer, and the second connection members are disposed between the first light extracting structure layer and the second current spreading layer, wherein a width of the first current spreading layer is larger than a width of the first connection member, and a width of the second conductive semiconductor layer is larger than a width of the second current spreading layer, wherein the first light extracting structure layer is disposed between the passivation layer and the second electrode, and wherein the first light extracting structure layer is in contact with a top surface of the second connection members.

21. The light emitting device of claim 20, wherein the passivation layer to surround a portion of the first conductive semiconductor layer, a portion of the active layer, and a portion of the second conductive semiconductor layer.

* * * * *